(12) United States Patent
Nagano

(10) Patent No.: US 11,509,061 B2
(45) Date of Patent: Nov. 22, 2022

(54) MILLIWAVE BAND RADIO WAVE ABSORPTION SHEET AND MILLIWAVE RADIO WAVE ABSORPTION METHOD

(71) Applicant: KANSAI PAINT CO., LTD., Hyogo (JP)

(72) Inventor: Toshiaki Nagano, Tokyo (JP)

(73) Assignee: KANSAI PAINT CO., LTD., Hyogo (JP)

(*) Notice: Subject to any disclaimer, the term of this patent is extended or adjusted under 35 U.S.C. 154(b) by 385 days.

(21) Appl. No.: 16/756,925

(22) PCT Filed: Jun. 27, 2018

(86) PCT No.: PCT/JP2018/024462
§ 371 (c)(1),
(2) Date: Apr. 17, 2020

(87) PCT Pub. No.: WO2019/077808
PCT Pub. Date: Apr. 25, 2019

(65) Prior Publication Data
US 2021/0194147 A1    Jun. 24, 2021

(30) Foreign Application Priority Data
Oct. 19, 2017 (JP) .............................. JP2017-202368

(51) Int. Cl.
*H01Q 17/00* (2006.01)
*H01Q 15/14* (2006.01)

(52) U.S. Cl.
CPC ........... *H01Q 17/004* (2013.01); *H01Q 15/14* (2013.01)

(58) Field of Classification Search
CPC ..... H01Q 17/004; H01Q 15/14; H01Q 17/008
See application file for complete search history.

(56) References Cited

U.S. PATENT DOCUMENTS

| 2001/0020054 A1* | 9/2001 | Toyoda ................ H01Q 17/008 |
| | | 524/440 |
| 2011/0168440 A1* | 7/2011 | Egami ....................... B32B 5/08 |
| | | 156/60 |

(Continued)

FOREIGN PATENT DOCUMENTS

| JP | 6-334382 A | 12/1994 |
| JP | 8-288684 A | 11/1996 |

(Continued)

OTHER PUBLICATIONS

International Search Report dated Sep. 18, 2018 issued in corresponding PCT/JP2018/024462 application (2 pages).

(Continued)

*Primary Examiner* — Khanh C Tran
(74) *Attorney, Agent, or Firm* — Millen White Zelano & Branigan, PC; Brion P. Heaney

(57) ABSTRACT

Provided is a light weight and remarkably flexible sheet-shaped radio wave absorber having excellent radio wave absorbing capacity in milliwave band frequencies. The invention is a milliwave band radio wave absorption sheet comprising a radio wave reflection layer (A), a radio wave absorption layer (B) disposed above the layer (A) so as to be parallel thereto, and a protective layer (C) disposed above the layer (B) so as to be parallel thereto. The layer (B) has, at a frequency of 79 GHz, a dielectric constant, wherein the real part is 10 to 20 and the absolute value of the imaginary part is 4 to 10. The layer (B) has a film thickness of 200 to 400 μm. The absolute value of the imaginary part/real part from the dielectric constant is within a range of 0.30 to 0.60. The layer (C) has, at a frequency of 79 GHz, a dielectric constant, wherein the real part is 1.5 to 8.0 and the absolute value of the imaginary part is less than 1.0, and has a film thickness of 50 to 200 μm. In the milliwave band radio wave absorption sheet, the optical reflectance at an incident angle (Continued)

of 60° is 50% or greater, and the optical reflectance at an incident angle of 20° is 25% or greater. In addition, the invention provides a milliwave band radio wave absorption method using the radio wave absorption sheet, and a radio wave damage prevention method involving the installation of the radio wave absorption sheet.

10 Claims, 2 Drawing Sheets

(56) References Cited

U.S. PATENT DOCUMENTS

| | | | | |
|---|---|---|---|---|
| 2014/0293467 | A1* | 10/2014 | Palikaras | G02B 5/20 359/885 |
| 2018/0354242 | A1* | 12/2018 | Hashimoto | B32B 15/18 |
| 2018/0375215 | A1* | 12/2018 | Nagamune | H05K 9/009 |
| 2019/0215994 | A1* | 7/2019 | Hiroi | H01Q 17/004 |
| 2020/0227833 | A1* | 7/2020 | Hiroi | C01G 49/00 |

FOREIGN PATENT DOCUMENTS

| | | |
|---|---|---|
| JP | 2000-261180 A | 9/2000 |
| JP | 2001-217645 A | 8/2001 |
| JP | 2002-271084 A | 9/2002 |
| JP | 2002-353682 A | 12/2002 |
| JP | 2003-133784 A | 5/2003 |
| JP | 2003198179 A | 7/2003 |

OTHER PUBLICATIONS

English Abstract of JP 6-334382 A published Dec. 2, 1994.
English Abstract of JP 8-288684 A published Nov. 1, 1996.
English Abstract of JP 2000-261180 A published Sep. 22, 2000.
English Abstract of JP 2001-217645 A published Aug. 10, 2001.
English Abstract of JP 2002-271084 A published Sep. 20, 2002.
English Abstract of JP 2002-353682 A published Dec. 6, 2002.
English Abstract of JP 2003-133784 A published May 9, 2003.
Search Report dated Jun. 16, 2021, for European Patent Application No. 18868717.2 (1-2 pages).

* cited by examiner

MILLIWAVE BAND RADIO WAVE ABSORPTION SHEET AND MILLIWAVE RADIO WAVE ABSORPTION METHOD

FIELD

The present invention relates to a radio wave absorber sheet having excellent absorption performance for milliwave band frequencies, and to a milliwave absorption method.

BACKGROUND

Radio waves are emitted from communication devices such as radios, televisions and wireless communication devices, while radio waves are also emitted from electronic devices such as cellular phones and personal computers which have been increasing in number with the development of information technology in recent years. A conventional method for avoiding malfunctioning of electronic devices and communication devices due to radio waves is to install a radio wave absorber (Electro Magnetic Absorber, EMA) that efficiently absorbs radio waves and converts the absorbed radio waves to heat energy, either near to or remote from the site where radio waves are generated.

An example of installing a radio wave absorber remotely from the site where radio waves are generated is a highway electronic toll collection system (ETC). An ETC is a system that, when an automobile passes through a highway toll gate exit, exchanges billing and other information using microwaves at a frequency of 5.8 GHz transmitted between a roadside antenna installed at the toll gate and the automobile antenna. At toll gates where such an ETC system has been installed, microwaves emitted from the antenna may be reflected by the toll gate roof or other parts, or extraneous radio waves from adjacent ETC lanes may leak, often causing communication errors. Such communication errors are reduced by installing radio wave absorbers on the toll gate roof or between ETC lanes. (See PTL 1).

Such radio wave absorbers are widely used, and radio wave absorbers made of a variety of materials and in different forms have been developed according to different purposes and uses.

Incidentally, pyramidal radio wave absorbers and stacked radio wave absorbers are types of radio wave absorbers that absorb radio waves across a wide band.

A pyramidal radio wave absorber is a radio wave absorber of a type in which radio wave energy is attenuated as the waves pass through the interior of the absorber. PTL 2 describes a radio wave absorber wherein a material comprising a foamable organic resin such as foamable polyethylene as the base material, kneaded with a conducting material such as carbon black or graphite, is molded into a shape with many connected pyramids. If the radio wave absorber itself has a concavo-convex form with pyramidal shapes, it is possible to reduce the cross-sectional area of the radio wave absorber surface section (the incident direction of radio waves), inhibiting reflection of incident waves at the surface and facilitating entry of radio waves into the absorber, and as the cross-sectional area of the absorber increases, radio waves that have entered into the absorber can be efficiently converted to heat energy.

A stacked radio wave absorber, on the other hand, is designed to absorb radio waves by stacking a radio wave reflection layer and a plurality of radio wave absorption layers, and as an example, PTL 3 discloses a radio wave absorber having a magnetic loss layer that includes metal powder and a binder formed on the surface of a metal sheet.

In recent years, electronic devices and communication devices have shifted toward products that utilize high frequency radio waves. For example, radio waves in the milliwave band are currently being used in a wide range of fields, including milliwave radars mounted on vehicles to prevent automobile collision, and millimeter radio waves utilized in high power irradiation radars used in the aerospace industry.

Although radio wave absorbers have been developed that absorb radio waves in the milliwave band, most of these are pyramid types, which have been associated with problems because the base materials undergo degeneration or deformation with passing time or by heat, resulting in lower radio wave absorption. In addition, because pyramidal radio wave absorbers are bulky they have been problematic due to difficult handling at installation locations, and also complex manufacturing steps.

In addition, conventional stacked radio wave absorbers have not reached a satisfactory level in terms of radio wave absorption in the milliwave band, and especially absorption frequency bandwidth. Technical difficulties have therefore existed in the design of lightweight and flexible radio wave absorbers that are capable of absorption in a wide milliwave band width, and that can be attached to curved surfaces.

CITATION LIST

Patent Literature

[PTL 1] JP 2001-217645 A
[PTL 2] JP H06-334382 A
[PTL 3] JP H08-288684 A

SUMMARY

Technical Problem

It is an object of the present invention to provide a radio wave absorber sheet having excellent radio wave absorption performance in the milliwave band of 76 to 81 GHz and excellent lightweightness and flexibility, as well as a radio wave absorption method and a method for preventing electromagnetic interference using the same.

Solution to Problem

As a result of ardent research on this problem, the present inventors have found that radio wave absorption properties in the milliwave band are very highly exhibited if a radio wave absorption layer combined with a radio wave reflection layer, and a protective layer disposed over it, satisfy specific conditions.

Specifically, the invention relates to a milliwave band radio wave absorption sheet comprising a radio wave reflection layer (A), a radio wave absorption layer (B) situated parallel to the top of the radio wave reflection layer (A), and a protective layer (C) situated parallel to the top of the radio wave absorption layer (B), wherein:

the real part of the relative permittivity of the radio wave absorption layer (B) at a frequency of 79 GHz is in the range of 10 to 20, the absolute value of the imaginary part is in the range of 4 to 10, the film thickness of the radio wave absorption layer (B) is in the range of 200 to 400 μm and the absolute value of the imaginary part/real part ratio of the relative permittivity is in the range of 0.30 to 0.60, and the real part of the relative permittivity of the protective layer (C) at a frequency of 79 GHz is in the range of 1.5 to 8.0, the absolute value of the imaginary part is less than 1.0, the film thickness of the protective layer (C) is in the range of 50 to 200 μm and the optical reflectance of the protective layer (C) is 50% or higher at an incident angle of 60° and 25% or higher at an incident angle of 20°, as well as a radio wave absorption method for the milliwave band using the radio wave absorption sheet and a method for preventing electromagnetic interference in which the radio wave absorption sheet is installed.

DESCRIPTION OF EMBODIMENTS

A embodiment of the milliwave band radio wave absorption sheet of the invention will now be described with reference to the attached drawings. For the purpose of the invention, the milliwave band is 76 to 81 GHz, which is the frequency for collision prevention and for automatic driving.

Figure 1:
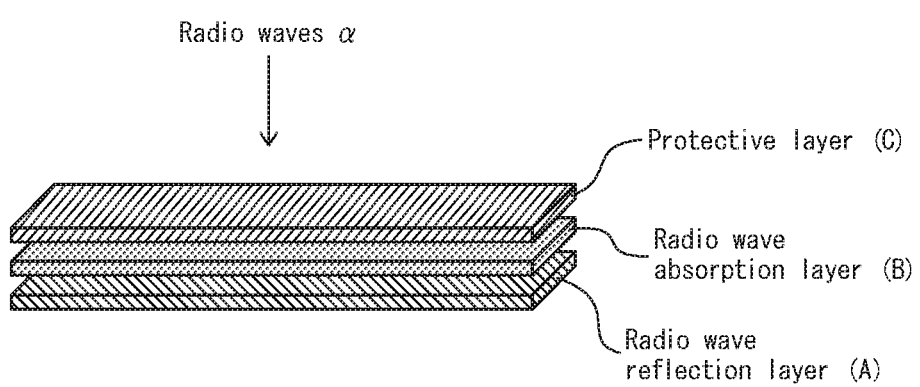
FIG. 1 is a schematic diagram representing the relationship between each of the layers composing a radio wave absorption sheet.

FIG. 1 is a schematic diagram representing the relationship between each of the layers composing a radio wave absorption sheet according to the invention.

In FIG. 1, a radio wave absorption layer (B) and a protective layer (C) are stacked in that order on a radio wave reflection layer (A). This radio wave absorption sheet is to be used for radio waves a impinging from the protective layer (C) side. Incidentally, while spaces are shown between each of the layers for illustration in FIG. 1, the layers will normally be closely bonded together for the invention.

<Radio Wave Reflection Layer (A)>

The radio wave reflection layer (A) causes surface reflection of radio waves a that have passed through the radio wave absorption layer (B) (described below) while being attenuated, and that have reached the reflection layer A.

The material of the radio wave reflection layer (A) is not restricted, but usually a metal sheet will be used. A metal foil is also included in the concept of a metal sheet. Examples for types of metals include tin, brass, copper, iron, nickel, stainless steel and aluminum.

The film thickness of the radio wave reflection layer (A) is not particularly restricted, but from the viewpoint of flexibility and installation manageability of the radio wave absorption sheet that is obtained at the final stage, it is preferably in the range of 10 to 500 μm and especially 30 to 300 μm.

For the purpose of the present specification, the film thickness can be determined by observing a cross-section of a test object using SEM, selecting 3 arbitrary locations from the obtained image and calculating the average.

<Radio Wave Absorption Layer (B)>

The radio wave absorption layer (B) in FIG. 1 is situated parallel to the top of the radio wave reflection layer (A), and its relative permittivity at 79 GHz and its film thickness satisfy specific conditions.

<Relative Permittivity>

According to the invention it is important for the frequency at which the relative permittivity is determined to be 79 GHz. With significant deviation from this value, even if the material is designed so that the relative permittivity at that frequency is within the range of the invention, it will be difficult for the radio wave absorption sheet that is obtained at the final stage to exhibit the desired radio wave absorption properties in the milliwave band.

The relative permittivity εr, as used herein, is the value represented by the following formula (1).

[Mathematical Formula 1]

$$\varepsilon r = \varepsilon' + \varepsilon'' i \qquad (1)$$

In formula (1), εr is the relative permittivity, ε' represents the real part of the relative permittivity, and ε" represents the imaginary part of the relative permittivity. Also, $i=\sqrt{(-1)}$.

The permittivity ε (F/m) of a material at 79 GHz is the value represented by the following formula (2), with the relative permittivity εr defined according to the invention representing the ratio of the permittivity ε (F/m) of the material with respect to the permittivity ε0(F/m) in a vacuum, and being unitless.

[Mathematical Formula 2]

$$\varepsilon = \varepsilon 0 \times \varepsilon r \qquad (2)$$

For example, if the relative permittivity a is represented by εr=5−3i, the "real part ε' of the relative permittivity" is 5 and the "absolute value of the imaginary part ε" of the relative permittivity" is 3.

According to the invention, the relative permittivity a at a frequency of 79 GHz is measured by the free-space S-parameter method (reflection-transmission method). For example, it can be determined by using a vector network analyzer ("PNA-X", trade name of Keysight Technologies) as the relative permittivity measuring instrument, using a free-space fixture and calibrating metal plate, and using "N1500 Materials Measurement Suite" (software, trade name of Keysight Technologies), with simulation from the measured value for the S-parameter.

Since the relative permittivity varies depending on the frequency, relative permittivity data is gathered for each frequency within the range of 76 to 81 GHz, and the relative permittivity value for the frequency of 79 GHz is selected from among the data.

It is a feature of the radio wave absorption layer (B) in the radio wave absorption sheet of the invention that the real part ε' of the relative permittivity at a frequency of 79 GHz is in the range of 10 to 20 and the absolute value of the imaginary part ε" of the relative permittivity is in the range of 4 to 10, and more preferably the real part ε' of the relative permittivity is in the range of 12 to 18 and the absolute value of the imaginary part ε" of the relative permittivity is in the range of 4 to 8.

If the real part ε' of the relative permittivity of the radio wave absorption layer (B) is less than 10, radio wave absorption by the radio wave absorption sheet in the milliwave band will be low, while radio wave absorption by the radio wave absorption sheet in the milliwave band will also tend to be lower if it is greater than 20, and therefore neither is desirable. If the absolute value of the imaginary part ε" of the relative permittivity of the radio wave absorption layer (B) is less than 4 then the radio wave absorption will be low, while radio wave absorption in the milliwave band will also be lower if it is greater than 10, and therefore neither is desirable.

The radio wave absorption layer (B) may be a film including dielectric powder and a binder. Such a film may be, for example, a film obtained by shaping a dispersion of dielectric powder in a binder into a film, or a coating film formed by coating and drying a radio wave-absorbing coating composition containing a binder, dielectric powder and a solvent.

<Binder>

Polymers, primarily, may be used for the binder. Specific examples include rubber components such as ester rubber, chlorosulfonated polyethylene rubber, chlorinated rubber, ethylene-propylene diene rubber chloroprene rubber, natural rubber, styrene-butadiene rubber, isoprene rubber, butadiene rubber, butyl rubber, ethylene-propylene rubber, acrylonitrile-butadiene rubber, chlorinated butyl rubber and brominated butyl rubber; resin components such as polyimides, polyphenylene sulfides, shellac, rosins, polyolefin resins, hydrocarbon resins, vinylidene chloride resins, polyamide resins, polyether ketone resins, vinyl chloride resins, polyester resins, alkyd resins, phenol resins, epoxy resins, acrylic resins, urethane resins, silicon-based resins, cellulosic resins and vinyl acetate resins; and combinations of the foregoing.

<Dielectric Powder>

Any material in any form may be used as the dielectric powder so long as it is a powder with dielectric properties. For example, it may be a metal such as Fe, Ni or Cr; an alloy such as sendust, Fe—Cr—Al omnr Fe—Si—Cr; spinel ferrite such as manganese-zinc ferrite, manganese. nickel-based ferrite, nickel-zinc ferrite, copper-zinc ferrite, zinc ferrite, cobalt ferrite or magnetite; hexagonal ferrite such as barium ferrite, strontium ferrite, M-type ferrite, Y-type ferrite, Z-type ferrite, W-type ferrite or U-type ferrite; garnet ferrite such as yttrium iron; a metal compound such as carbonyl iron; fine reduced iron powder or permalloy; a conductive powder such as ITO; conductive carbon; insulating carbon; or the like. These may be used alone or in combinations of more than one.

The mean particle size of the dielectric powder is preferably 0.001 to 500 μm and more preferably 0.01 to 100 μm. When the dielectric powder is in needle-like form, the mean minor axis diameter is preferably 0.001 to 500 μm and more preferably 0.01 to 100 μm.

In the present specification, the mean particle size or mean minor axis diameter of dielectric powder is that measured using SEM, based on observation of an SEM image of the radio wave absorption sheet of the invention.

It is suitable for the dielectric powder to include ferrite as a portion thereof from the viewpoint of radio wave absorption by the radio wave absorption sheet of the invention in the milliwave band.

Ferrites include spinel ferrites such as manganese-zinc ferrite, manganese-nickel-based ferrite, nickel-zinc ferrite, copper-zinc ferrite, zinc ferrite, cobalt ferrite and magnetite; hexagonal ferrites such as barium ferrite, strontium ferrite, M-type ferrite, Y-type ferrite, Z-type ferrite, W-type ferrite and U-type ferrite; and garnet ferrites such as yttrium iron; as well as combinations of two or more of the foregoing.

Incidentally, ferrite generally acts as a magnetic body, but it exhibits no magnetism at 76 to 81 GHz and can therefore be treated as a dielectric material for the purpose of the invention.

The amount of dielectric powder to be included in the radio wave absorption layer (B) may be appropriately adjusted based on the type of dielectric powder, but a suitable amount will generally be 50 to 500 parts by mass and preferably 100 to 400 parts by mass based on 100 parts by mass of the binder.

The film thickness of the radio wave absorption layer (B) is also an important factor for exhibiting a high level of radio wave absorption in the milliwave band range. According to the invention, the film thickness of the radio wave absorption layer (B) is in the range of 200 to 400 μm and more preferably 200 to 300 μm. If the film thickness of the radio wave absorption layer (B) is less than 200 μm the radio wave absorption of the radio wave absorption sheet in the milliwave band will be lower, while the radio wave absorption in the milliwave band will also be lowered if it is greater than 400 μm.

In addition to the relative permittivity and film thickness of the radio wave absorption layer (B), the tangent delta value is also important as an index of radio wave absorption in the milliwave band, for the purpose of the invention.

The radio wave absorption properties of the radio wave absorption sheet of the invention in the milliwave band can only be adequately exhibited if the tangent delta value is in the range of 0.30 to 0.60, while the conditions for the relative permittivity and film thickness of the radio wave absorption layer (B) are also satisfied.

The tangent delta value is a numerical value representing the degree of electrical energy loss in a dielectric material, and in the present specification it is obtained by calculating the absolute value of the imaginary part/real part ratio from the relative permittivity.

The tangent delta value is more preferably 0.35 to 0.48.

The radio wave absorption layer (B) of the invention may have a monolayer structure or a multilayer structure, but having a monolayer structure is effective because it can shorten the time required for production of the radio wave absorption sheet as the final product, and can result in suitable flexibility and radio wave absorption in the milliwave band.

<Protective Layer (C)>

The protective layer (C) in FIG. 1 is situated parallel to the top of the radio wave absorption layer (B), and it is an essential constituent component if the radio wave absorption sheet of the invention is to have the desired radio wave absorption in the milliwave band. It is necessary for the radio wave absorption layer (B) to be situated on the radio wave reflection layer (A) and for the protective layer (C) to be situated on the radio wave absorption layer (B) in that order, as shown in FIG. 1. According to the invention, if the radio wave reflection layer (A), radio wave absorption layer (B) or protective layer (C) is lacking, the radio wave absorption sheet will be unable to exhibit sufficient radio wave absorption in the milliwave band.

Furthermore, providing the protective layer (C) can protect each of the layers located under it and can contribute a design property to the radio wave absorption sheet.

The protective layer (C) may be a molded film, or it may be a coating film obtained by coating and drying a coating composition. The protective layer (C) may also have either a monolayer structure or a multilayer structure.

It is a feature of the invention that the optical reflectance of the protective layer (C) is 50% or higher at an incident angle of 60° and 25% or higher at an incident angle of 20°. If the optical reflectance is outside of this range, it is undesirable because the radio wave absorption sheet will not exhibit adequate milliwave absorption and the weather resistance and flexibility will be lowered.

The optical reflectance of the protective layer (C) is suitably in the range of 50% or higher and preferably 60 to 92% at an incident angle of 60°, and 25% or higher and preferably 30 to 80% at an incident angle of 20°.

As used herein, the optical reflectance is the value measured by the method of JIS Z 8741, by irradiating light from a light source at an incident angle of X° (where X is 60° or 20°) onto the surface of an object to be measured that has been set on the black side of hiding power test paper, measuring the specular reflected light flux (ψs), and determining the numerical value represented as the ratio with reference to the specular reflected light flux (ψos) on a glass surface with a refractive index of n=1.567 under the same conditions [Gs(X)=ψs/ψos×100(%)]. For example, it can be measured using a gloss meter such as a Micro-TRI-Gloss (LED light source) by BYK-Gardner.

According to the invention, it is important for the protective layer (C) to have a film thickness and optical reflectance within the ranges prescribed by the invention, and while there are no particular restrictions on the material of the protective layer (C), it may suitably be a film that includes a polymer (synthetic resin) as the binder. Such polymers include the same ones mentioned as compounds for the radio wave absorption layer (B), among which vinyl chloride resins and polyurethane resins are preferred.

For the purpose of the present specification, films that include polyurethane resins are not only ones with polyurethane resins as binders, but also polyurethane resin films obtained by mixing a component including a hydroxyl-containing resin and a polyisocyanate, and coating and hardening the mixture to obtain a film.

When the protective layer (C) includes a vinyl chloride resin as the binder, it may be one containing a vinyl chloride resin alone, or it may be one also containing another resin such as a polyurethane resin or (meth)acrylic resin.

It is also suitable for the protective layer (C) to contain a coloring agent, from the viewpoint of weather resistance of the radio wave absorption sheet. A color pigment or dye may be used as a coloring agent.

Conventionally known color pigments may be used. Examples include black pigments such as carbon black, copper oxide, triiron tetroxide, manganese dioxide, aniline black and active carbon; yellow pigments such as chrome yellow, zinc yellow, cadmium yellow, yellow iron oxide, mineral fast yellow, nickel titanium yellow, navels yellow, Naphthol Yellow S, Hansa Yellow, Benzidine Yellow G, Benzidine Yellow GR, Quinoline Yellow Lake, Permanent Yellow NCG and tartrazine lake; red pigments such as colcothar, cadmium red, red lead, mercury sulfide, cadmium, Permanent Red 4R, Lithol Red, Pyrazolone Red, Watching Red, calcium salts, Lake Red D, Brilliant Carmin 6B, eosin lake, Rhodamine Lake B, alizarin lake and Brilliant Carmin 3B; blue pigments such as Prussian blue, cobalt blue, alkali blue lake, Victoria blue lake, phthalocyanine blue, metal-free phthalocyanine blue, partially chlorinated phthalocyanine blue, fast sky blue, and Indanthrene Blue BC; green pigments such as chromium green, chromium oxide, Pigment Green B, Malachite Green Lake and Final Yellow Green G; and white pigments such as zinc white, titanium oxide, antimony white and zinc sulfide. These may be used alone or in combinations of more than one. Examples of dyes to be used are basic dyes, acidic dyes, disperse dyes and direct dyes. Such dyes include nigrosine, methylene blue, Rose Bengal, quinoline yellow and ultramarine blue.

The amounts of coloring agents added will differ depending on the types used, but from the viewpoint of radio wave absorption in the milliwave band they will generally be in the range of 0.1 to 300 parts by mass and especially 5 to 150 parts by mass based on the mass of the polymer in the colored film of the protective layer (C).

The protective layer (C) has a hiding power of preferably in the range of 50% or higher and especially 70% or higher.

Throughout the present specification, the hiding power of the protective layer (C) is determined by placing the protective layer (C) on hiding power test paper according to JIS K5600 4-1 Method B, measuring the tristimulus value Y through the protective layer (C) at the white sections (YW) and black sections (YB), and calculating YB/YW as a percentage.

The film thickness of the protective layer (C) is also important for exhibiting a high level of radio wave absorption in the milliwave band range. It is a feature of the invention that the film thickness of the protective layer (C) is in the range of 50 to 200 μm, with the range of 50 to 100 μm being more preferred. If the film thickness of the protective layer (C) is less than 50 μm, radio wave absorption of the radio wave absorption sheet in the milliwave band will be lowered, and if it is greater than 200 μm, radio wave absorption of the radio wave absorption sheet in the milliwave band will be lowered and the weight will increase.

According to the invention, it is suitable if the relative permittivity at a frequency of 79 GHz by the protective layer (C) alone has a real part $\varepsilon'$ of 1.5 to 8.0 and especially 2.0 to 5.0 and the absolute value of the imaginary part $\varepsilon''$ of the relative permittivity is less than 1.0 and especially less than 0.1. The tangent delta value is suitably in the range of no greater than 0.1 and especially no greater than 0.01.

<Radio Wave Absorption Sheet>

The radio wave absorption sheet of the invention is composed of a radio wave reflection layer (A), a radio wave absorption layer (B) and a protective layer (C), and a known method may be used to attach each of the layers. Each layer may be formed by coating and drying a liquid coating material, or if they are formed by attaching films, adhesive layers (P) may be provided as necessary between each of the films.

<Adhesive Layer (P)>

An adhesive layer (P) is a layer to be provided as necessary, for the purpose of increasing adhesion between the layers and increasing the durability of the radio wave absorption sheet.

The form of adhesive composing the adhesive layer (P) may be an aqueous dispersion, solution, two-pack solution mixture, solid or tape. There are no particular restrictions on the material, which may be an organic adhesive or an inorganic adhesive.

Examples of organic adhesives include synthetic adhesives that are vinyl acetate-based, vinyl acetate resin emulsion-based, vinyl resin-based, ethylene-vinyl acetate resin-based, polyvinyl acetate resin-based, epoxy resin-based, polyvinyl alcohol-based, ethylene-vinyl acetate-based, vinyl chloride-based, α-olefin-based, acrylic resin-based, polyamide-based, polyimide-based, cellulosic, polyvinylpyrrolidone-based, polystyrene-based, polystyrene resin-based, cyano acrylate-based, polyvinylacetal-based, urethane resin-based, polyolefin resin-based, polyvinyl butyral resin-based, polyaromatic-based, urea resin-based, melamine resin-based, phenol resin-based, resorcinol-based, chloroprene rubber-based, nitrile rubber-based, styrene-butadiene rubber-based, polybenzimidazole-based, thermoplastic elastomer-based, butyl rubber-based, silicone-based, modified silicon-based, silylated urethane-based, urethane rubber-based, polysulfite-based or acrylic rubber-based; natural adhesives that are starch-based, natural rubber-based, asphalt, glue, gum arabic, lacquer, casein, soybean protein or rosin; and reactive hot-melt adhesives.

Inorganic adhesives include sodium silicate, cements (Portland cement, plaster, gypsum, magnesium cement, litharge cement and dental cement) and ceramics.

Synthetic adhesives are most suitable among these adhesives from the viewpoint of flexibility of the radio wave absorption sheet, and its radio wave absorption in the milliband-wave band.

The film thickness of the adhesive layer (P) is not particularly restricted, but from the viewpoint of radio wave absorption in the milliwave band it may generally be up to 100 μm and especially in the range of 7 to 80 μm.

<Radio Wave Absorption Method>

The present invention provides a method of absorbing radio waves in the milliwave band by using a radio wave absorption sheet as described above.

The invention also provides a method for preventing electromagnetic interference, wherein the aforementioned radio wave absorption sheet is installed on a radio wave reflector that is a cause of malfunctioning electromagnetic interference, or the radio wave absorption sheet is installed between the radio wave reflector and a radio wave receiver.

The radio wave reflector to be installed directly on or near the radio wave absorption sheet of the invention is not particularly restricted so long as it is an article or structure in an environment in which radio waves in the milliwave band are generated.

Specific examples that may be mentioned include articles and structures near automobile roads, such as median strips, tunnel walls, sound insulation walls, noise control walls, road signs, guard rails, road reflection mirrors, telephone poles, traffic lights, traffic signs, roadside trees and road lighting poles.

EXAMPLES

The present invention will now be explained in more specific detail through the following examples, with the understanding that the invention is in no way limited only to the examples. The "parts" and "%" values in the examples refer to "parts by mass" and "mass %", respectively.

<Production of Radio Wave Absorption Sheets>

Example 1

A 10 μm adhesive layer (cyano acrylate-based adhesive) was formed on a 50 μm-thick aluminum foil (Al foil) with a length of 30 cm and a width of 30 cm, 150 parts of Mn—Zn ferrite (manganese-zinc-based ferrite, mean particle size: 0.7 μm) was kneaded with 100 parts of EPDM rubber (ethylene propylene diene rubber) and shaped into a monolayer structure sheet with a film thickness of 230 μm and stacked over it, and then a 10 μm adhesive layer (cyano acrylate-based adhesive) was formed over this and a 80 μm-thick protective sheet* was attached to it, to obtain a radio wave absorption sheet (X-1).

*Protective sheet: Colored film containing vinyl chloride resin and titanium oxide. The amount of titanium oxide was 80 parts by mass with respect to 100 parts by mass of the vinyl chloride resin, the optical reflectance at an incident angle of 60° was 78 and the optical reflectance at an incident angle of 20° was 40.

Examples 2 to 12 and Comparative Examples 1 to 10

Radio wave absorption sheets (X-2) to (X-22) were obtained as sheets in the same manner as Example 1, except that the materials and thicknesses of the radio wave absorption layers and protective layers were as listed in Table 1. In the tables, "phr" means the mass ratio of each component with respect to 100 parts by mass of the binder. Also in the tables, "j" in the Protective Layer Relative Permittivity row has the same definition as "i" representing the relative permittivity of the radio wave absorption layer. Thus, the real part of the relative permittivity of the protective layer in Example 1 is 4.0 and the absolute value of the imaginary part is 0.005.

TABLE 1

|  |  |  | Example 1 X-1 | Example 2 X-2 | Example 3 X-3 |
|---|---|---|---|---|---|
| Construction | Radio wave reflection layer (A) | Radio wave reflection layer | Al foil | Al foil | Al foil |
|  |  | Film thickness (μm) of radio wave reflection layer | 50 | 50 | 50 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Radio wave absorption layer (B) | Radio wave absorption layer | EPDM RUBBER MnZn ferrite (150 phr) | EPDM RUBBER MnZn ferrite (150 phr) | EPDM RUBBER MnZn ferrite (150 phr) |
|  |  | Film thickness (μm) of radio wave absorption layer | 230 | 230 | 230 |
|  |  | Relative permittivity of radio wave absorption layer | $E = 14.5 - 6i$ | $E = 14.5 - 6i$ | $E = 14.5 - 6i$ |
|  |  | Tangent delta | 0.43 | 0.43 | 0.43 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Protective layer (C) | Protective layer    Coloring film | Vinyl chloride resin Titanium oxide (80 phr) | Vinyl chloride resin Phthalocyanine blue (10 phr) | Vinyl chloride resin Carbon black (5 phr) |
|  |  | Film thickness (μm) of protective layer | 80 | 80 | 80 |
|  |  | Optical reflectance    60° | 78 | 77 | 90 |
|  |  | 20° | 40 | 36 | 75 |
|  |  | Relative permittivity of protective layer | 4.0 − j0.005 | 3.1 − j0.006 | 3.0 − j0.001 |
|  |  | Tangent delta | 0.001 | 0.002 | 0.0003 |
|  |  | Hiding power of protective layer/% | 100 | 100 | 100 |
| Total film thickness (mm) |  |  | 0.38 | 0.38 | 0.38 |
| Absorption properties |  | Peak frequency (GHz) | 79 | 80 | 80.5 |
|  |  | Absorption (dB) | −42 | −35 | −33 |
|  |  | Δf (≥−20 dB) | 5.0 GHz | 4.9 GHz | 4.9 GHz |
| Outer appearance |  |  | White | Blue | Black |
| Flexibility |  |  | G | G | G |
| Weather resistance |  |  | G | G | G |

TABLE 1-continued

|  |  |  | Example | | |
|---|---|---|---|---|---|
|  |  |  | 4<br>X-4 | 5<br>X-5 | 6<br>X-6 |
| Construction | Radio wave reflection layer (A) | Radio wave reflection layer | Al foil | Al foil | Al foil |
|  |  | Film thickness (μm) of radio wave reflection layer | 50 | 50 | 50 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Radio wave absorption layer (B) | Radio wave absorption layer | EPDM RUBBER MnZn ferrite (150 phr) | EPDM RUBBER MnZn ferrite (150 phr) | EPDM RUBBER MnZn ferrite (120 phr) |
|  |  | Film thickness (μm) of radio wave absorption layer | 290 | 210 | 250 |
|  |  | Relative permittivity of radio wave absorption layer | E = 14.5 − 6i | E = 14.5 − 6i | E = 13 − 5i |
|  |  | Tangent delta | 0.43 | 0.43 | 0.38 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Protective layer (C) | Protective layer    Coloring film | Vinyl chloride resin<br>Titanium oxide (80 phr) | Vinyl chloride resin<br>Titanium oxide (80 phr) | Vinyl chloride resin<br>Titanium oxide (80 phr) |
|  |  | Film thickness (μm) of protective layer | 80 | 80 | 80 |
|  |  | Optical reflectance    60° | 78 | 78 | 78 |
|  |  | 20° | 40 | 40 | 40 |
|  |  | Relative permittivity of protective layer | 4.0 − j0.005 | 4.0 − j0.005 | 4.0 − j0.005 |
|  |  | Tangent delta | 0.001 | 0.001 | 0.001 |
|  |  | Hiding power of protective layer/% | 100 | 100 | 100 |
| Total film thickness (mm) |  |  | 0.44 | 0.36 | 0.4 |
| Absorption properties |  | Peak frequency (GHz) | 77 | 80.9 | 80 |
|  |  | Absorption (dB) | −33 | −30 | −35 |
|  |  | Δf (≥−20 dB) | 4.8 GHz | 4.7 GHz | 4.3 GHz |
| Outer appearance |  |  | White | White | White |
| Flexibility |  |  | G | G | G |
| Weather resistance |  |  | G | G | G |

TABLE 2

|  |  |  | Example | | |
|---|---|---|---|---|---|
|  |  |  | 7<br>X-7 | 8<br>X-8 | 9<br>X-9 |
| Construction | Radio wave reflection layer (A) | Radio wave reflection layer | Al foil | Al foil | Al foil |
|  |  | Film thickness (μm) of radio wave reflection layer | 50 | 50 | 50 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Radio wave absorption layer (B) | Radio wave absorption layer | EPDM RUBBER MnZn ferrite (180 phr) | Urethane resin MnZn ferrite (150 phr) | Urethane resin NiZn ferrite (200 phr) |
|  |  | Film thickness (μm) of radio wave absorption layer | 220 | 230 | 225 |
|  |  | Relative permittivity of radio wave absorption layer | E = 17 − 7i | E = 14.5 − 6i | E = 17 − 6.2i |
|  |  | Tangent delta | 0.41 | 0.43 | 0.36 |
|  | Adhesive layer (P) | Adhesive layer | Cyanoacrylate | Cyanoacrylate | Cyanoacrylate |
|  |  | Film thickness (μm) of adhesive layer | 10 | 10 | 10 |
|  | Protective layer (C) | Protective layer    Coloring film | Vinyl chloride resin<br>Titanium oxide (80 phr) | Polyurethane resin<br>Titanium oxide (80 phr) | Vinyl chloride resin<br>Titanium oxide (80 phr) |
|  |  | Film thickness (μm) of protective layer | 80 | 80 | 80 |
|  |  | Optical reflectance    60° | 78 | 78 | 78 |
|  |  | 20° | 40 | 40 | 40 |
|  |  | Relative permittivity of protective layer | 4.0 − j0.005 | 4.0 − j0.005 | 4.0 − j0.005 |
|  |  | Tangent delta | 0.001 | 0.001 | 0.001 |
|  |  | Hiding power of protective layer/% | 100 | 100 | 100 |
| Total film thickness (mm) |  |  | 0.37 | 0.38 | 0.38 |
| Absorption properties |  | Peak frequency (GHz) | 78 | 79 | 77 |
|  |  | Absorption (dB) | −40 | −42 | −32 |
|  |  | Δf (≥−20 dB) | 4.9 GHz | 5.0 GHz | 3.0 GHz |
| Outer appearance |  |  | White | White | White |
| Flexibility |  |  | G | G | G |
| Weather resistance |  |  | G | G | G |

TABLE 2-continued

| | | | Example | | |
|---|---|---|---|---|---|
| | | | 10<br>X-10 | 11<br>X-11 | 12<br>X-12 |
| Construction | Radio wave reflection layer (A) | Radio wave reflection layer | Al foil | Al foil | Al foil |
| | | Film thickness (μm) of radio wave reflection layer | 50 | 50 | 50 |
| | Adhesive layer (P) | Adhesive layer | Cyanoacrylate | Cyanoacrylate | Cyanoacrylate |
| | | Film thickness (μm) of adhesive layer | 10 | 10 | 10 |
| | Radio wave absorption layer (B) | Radio wave absorption layer | EPDM RUBBER MnZn ferrite (150 phr) | EPDM RUBBER MnZn ferrite (150 phr) | EPDM RUBBER MnZn ferrite (150 phr) |
| | | Film thickness (μm) of radio wave absorption layer | 230 | 230 | 230 |
| | | Relative permittivity of radio wave absorption layer | E = 14.5 − 6i | E = 14.5 − 6i | E = 14.5 − 6i |
| | | Tangent delta | 0.43 | 0.43 | 0.43 |
| | Adhesive layer (P) | Adhesive layer | Cyanoacrylate | Cyanoacrylate | Cyanoacrylate |
| | | Film thickness (μm) of adhesive layer | 10 | 10 | 10 |
| | Protective layer (C) | Protective layer   Coloring film | Polypropylene resin Titanium oxide (80 phr) | Vinyl chloride resin Titanium oxide (80 phr) | Vinyl chloride resin Titanium oxide (80 phr) Polyurethane resin Titanium oxide (80 phr) |
| | | Film thickness (μm) of protective layer | 80 | 55 | 95 |
| | | Optical reflectance    60° | 75 | 78 | 78 |
| | |                       20° | 38 | 40 | 40 |
| | | Relative permittivity of protective layer | 3.9 − j0.005 | 4.0 − j0.005 | 4.0 − j0.005 |
| | | Tangent delta | 0.001 | 0.001 | 0.001 |
| | | Hiding power of protective layer/% | 100 | 100 | 100 |
| Total film thickness (mm) | | | 0.38 | 0.36 | 0.40 |
| Absorption properties | | Peak frequency (GHz) | 78 | 80 | 79 |
| | | Absorption (dB) | −35 | −34 | −37 |
| | | Δf (≥−20 dB) | 5.0 GHz | 5.0 GHz | 5.0 GHz |
| Outer appearance | | | White | White | White |
| Flexibility | | | G | G | G |
| Weather resistance | | | G | G | G |

TABLE 3

| | | | Comparative Example | | |
|---|---|---|---|---|---|
| | | | 1<br>X-13 | 2<br>X-14 | 3<br>X-15 |
| Construction | Radio wave reflection layer (A) | Radio wave reflection layer | Al foil | Al foil | Al foil |
| | | Film thickness (μm) of radio wave reflection layer | 50 | 50 | 50 |
| | Adhesive layer (P) | Adhesive layer | Cyanoacrylate | Cyanoacrylate | Cyanoacrylate |
| | | Film thickness (μm) of adhesive layer | 10 | 10 | 10 |
| | Radio wave absorption layer (B) | Radio wave absorption layer | EPDM RUBBER MnZn ferrite (150 phr) | EPDM RUBBER MnZn ferrite (150 phr) | EPDM RUBBER MnZn ferrite (90 phr) |
| | | Film thickness (μm) of radio wave absorption layer | 190 | 410 | 250 |
| | | Relative permittivity of radio wave absorption layer | E = 14.5 − 6i | E = 14.5 − 6i | E = 11 − 3i |
| | | Tangent delta | 0.43 | 0.43 | 0.33 |
| | Adhesive layer (P) | Adhesive layer | Cyanoacrylate | Cyanoacrylate | Cyanoacrylate |
| | | Film thickness (μm) of adhesive layer | 10 | 10 | 10 |
| | Protective layer (C) | Protective layer   Coloring film | Vinyl chloride resin Titanium oxide (80 phr) | Vinyl chloride resin Titanium oxide (80 phr) | Vinyl chloride resin Titanium oxide (80 phr) |
| | | Film thickness (μm) of protective layer | 80 | 80 | 80 |
| | | Optical reflectance    60° | 78 | 78 | 78 |
| | |                       20° | 40 | 40 | 40 |
| | | Relative permittivity of protective layer | 4.0 − j0.005 | 4.0 − j0.005 | 4.0 − j0.005 |
| | | Tangent delta | 0.001 | 0.001 | 0.001 |
| | | Hiding power of protective layer/% | 100 | 100 | 100 |
| Total film thickness (mm) | | | 0.34 | 0.56 | 0.4 |
| Absorption properties | | Peak frequency (GHz) | 82 | 76 | 82 |
| | | Absorption (dB) | −7 | −6 | −12 |
| | | Δf (≥−20 dB) | — | — | — |
| Outer appearance | | | White | White | White |
| Flexibility | | | G | G | G |
| Weather resistance | | | G | G | G |

TABLE 3-continued

|  |  |  | Comparative Example | |
|---|---|---|---|---|
|  |  |  | 4<br>X-16 | 5<br>X-17 |
| Construction | Radio wave reflection layer (A) | Radio wave reflection layer | Al foil | Al foil |
|  |  | Film thickness (μm) of radio wave reflection layer | 50 | 50 |
|  | Adhesive layer (P) | Adhesive layer | Cyanoacrylate | Cyanoacrylate |
|  |  | Film thickness (μm) of adhesive layer | 10 | 10 |
|  | Radio wave absorption layer (B) | Radio wave absorption layer | EPDM RUBBER<br>MnZn ferrite<br>(300 phr) | Urethane resin<br>NiZn ferrite<br>(200 phr) |
|  |  | Film thickness (μm) of radio wave absorption layer | 230 | 225 |
|  |  | Relative permittivity of radio wave absorption layer | E = 21 − 11i | E = 17 − 6.2i |
|  |  | Tangent delta | 0.52 | 0.36 |
|  | Adhesive layer (P) | Adhesive layer | Cyanoacrylate | Cyanoacrylate |
|  |  | Film thickness (μm) of adhesive layer | 10 | 10 |
|  | Protective layer (C) | Protective layer   Coloring film | Vinyl chloride resin<br>Titanium oxide<br>(80 phr) | Vinyl chloride resin<br>Titanium oxide<br>(80 phr) |
|  |  | Film thickness (μm) of protective layer | 80 | 210 |
|  |  | Optical reflectance   60° | 78 | 78 |
|  |  | 20° | 40 | 40 |
|  |  | Relative permittivity of protective layer | 4.0 − j0.005 | 4.0 − j0.005 |
|  |  | Tangent delta | 0.001 | 0.001 |
|  |  | Hiding power of protective layer/% | 100 | 100 |
| Total film thickness (mm) |  |  | 0.38 | 0.505 |
| Absorption properties |  | Peak frequency (GHz) | 77 | 76 |
|  |  | Absorption (dB) | −8 | −13 |
|  |  | Δf (≥−20 dB) | — | — |
| Outer appearance |  |  | White | White |
| Flexibility |  |  | G | G |
| Weather resistance |  |  | G | G |

TABLE 4

|  |  |  | Comparative Example | | |
|---|---|---|---|---|---|
|  |  |  | 6<br>X-18 | 7<br>X-19 | 8<br>X-20 |
| Construction | Radio wave reflection layer (A) | Radio wave reflection layer | Al foil |  | Al foil |
|  |  | Film thickness (μm) of radio wave reflection layer | 50 |  | 50 |
|  | Adhesive layer (P) | Adhesive layer | Cyanoacrylate |  | Cyanoacrylate |
|  |  | Film thickness (μm) of adhesive layer | 10 |  | 10 |
|  | Radio wave absorption layer (B) | Radio wave absorption layer | EPDM RUBBER<br>MnZn ferrite<br>(150 phr) | EPDM RUBBER<br>MnZn ferrite<br>(150 phr) | EPDM RUBBER<br>MnZn ferrite<br>(550 phr) |
|  |  | Film thickness (μm) of radio wave absorption layer | 230 | 230 | 230 |
|  |  | Relative permittivity of radio wave absorption layer | E = 14.5 − 6i | E = 14.5 − 6i | E = 23 − 15i |
|  |  | Tangent delta | 0.43 | 0.43 | 0.65 |
|  | Adhesive layer (P) | Adhesive layer |  | Cyanoacrylate | Cyanoacrylate |
|  |  | Film thickness (μm) of adhesive layer |  | 10 | 10 |
|  | Protective layer (C) | Protective layer   Coloring film |  | Vinyl chloride resin<br>Titanium oxide<br>(80 phr) | Vinyl chloride resin<br>Titanium oxide<br>(80 phr) |
|  |  | Film thickness (μm) of protective layer |  | 80 | 80 |
|  |  | Optical reflectance   60° |  | 78 | 78 |
|  |  | 20° |  | 40 | 40 |
|  |  | Relative permittivity of protective layer |  | 4.0 − j0.005 | 4.0 − j0.005 |
|  |  | Tangent delta |  | 0.001 | 0.001 |
|  |  | Hiding power of protective layer/% |  | 100 | 100 |
| Total film thickness (mm) |  |  | 0.29 | 0.32 | 0.38 |
| Absorption properties |  | Peak frequency (GHz) | 82 | — | 75 |
|  |  | Absorption (dB) | −14 | — | −6 |
|  |  | Δf (≥−20 dB) | — | — | — |
| Outer appearance |  |  | Brown | White | White |
| Flexibility |  |  | G | G | G |
| Weather resistance |  |  | G | G | G |

TABLE 4-continued

|  |  |  | Comparative Example | |
|---|---|---|---|---|
|  |  |  | 9<br>X-21 | 10<br>X-22 |
| Construction | Radio wave reflection layer (A) | Radio wave reflection layer | Al foil | Al foil |
|  |  | Film thickness (μm) of radio wave reflection layer | 50 | 50 |
|  | Adhesive layer (P) | Adhesive layer | Cyanoacrylate | Cyanoacrylate |
|  |  | Film thickness (μm) of adhesive layer | 10 | 10 |
|  | Radio wave absorption layer (B) | Radio wave absorption layer | EPDM RUBBER<br>MnZn ferrite<br>(45 phr) | EPDM RUBBER<br>MnZn ferrite<br>(150 phr) |
|  |  | Film thickness (μm) of radio wave absorption layer | 230 | 230 |
|  |  | Relative permittivity of radio wave absorption layer | $E = 9 - 2.3i$ | $E = 14.5 - 6i$ |
|  |  | Tangent delta | 0.25 | 0.43 |
|  | Adhesive layer (P) | Adhesive layer | Cyanoacrylate | Cyanoacrylate |
|  |  | Film thickness (μm) of adhesive layer | 10 | 10 |
|  | Protective layer (C) | Protective layer      Coloring film | Vinyl chloride resin<br>Titanium oxide<br>(80 phr) | Vinyl chloride resin<br>Titanium oxide<br>(250 phr) |
|  |  | Film thickness (μm) of protective layer | 80 | 80 |
|  |  | Optical reflectance      60° | 78 | 45 |
|  |  | 20° | 40 | 20 |
|  |  | Relative permittivity of protective layer | $4.0 - j0.005$ | $8.2 - j0.05$ |
|  |  | Tangent delta | 0.001 | 0.001 |
|  |  | Hiding power of protective layer/% | 100 | 100 |
| Total film thickness (mm) |  |  | 0.38 | 0.38 |
| Absorption properties |  | Peak frequency (GHz) | 82 | 77 |
|  |  | Absorption (dB) | −3 | −18 |
|  |  | Δf (≥−20 dB) | — | — |
| Outer appearance |  |  | White | White |
| Flexibility |  |  | G | F |
| Weather resistance |  |  | G | P |

(Note 1) Mn—Zn ferrite: Manganese-zinc-based ferrite, mean particle size: 0.7 μm,
(Note 2) Mn—Ni ferrite: Manganese-nickel-based ferrite, mean particle size: 0.4 μm.

<Evaluation Test>

The radio wave absorption sheets (X-1) to (X-22) fabricated in the Examples and Comparative Examples were evaluated with the following criteria and methods, and the property values of each of the radio wave absorption sheets are shown together in Table 1. The relative permittivity of the radio wave absorption layer (B) and the optical reflectance of the protective layer (C) at an incident angle of 60° and its optical reflectance at an incident angle of 20°, shown in Table 1, were determined by the methods described in the present specification.

(*) Measurement of Radio Wave Absorption of Each Radio Wave Absorption Sheet

Figure 2:
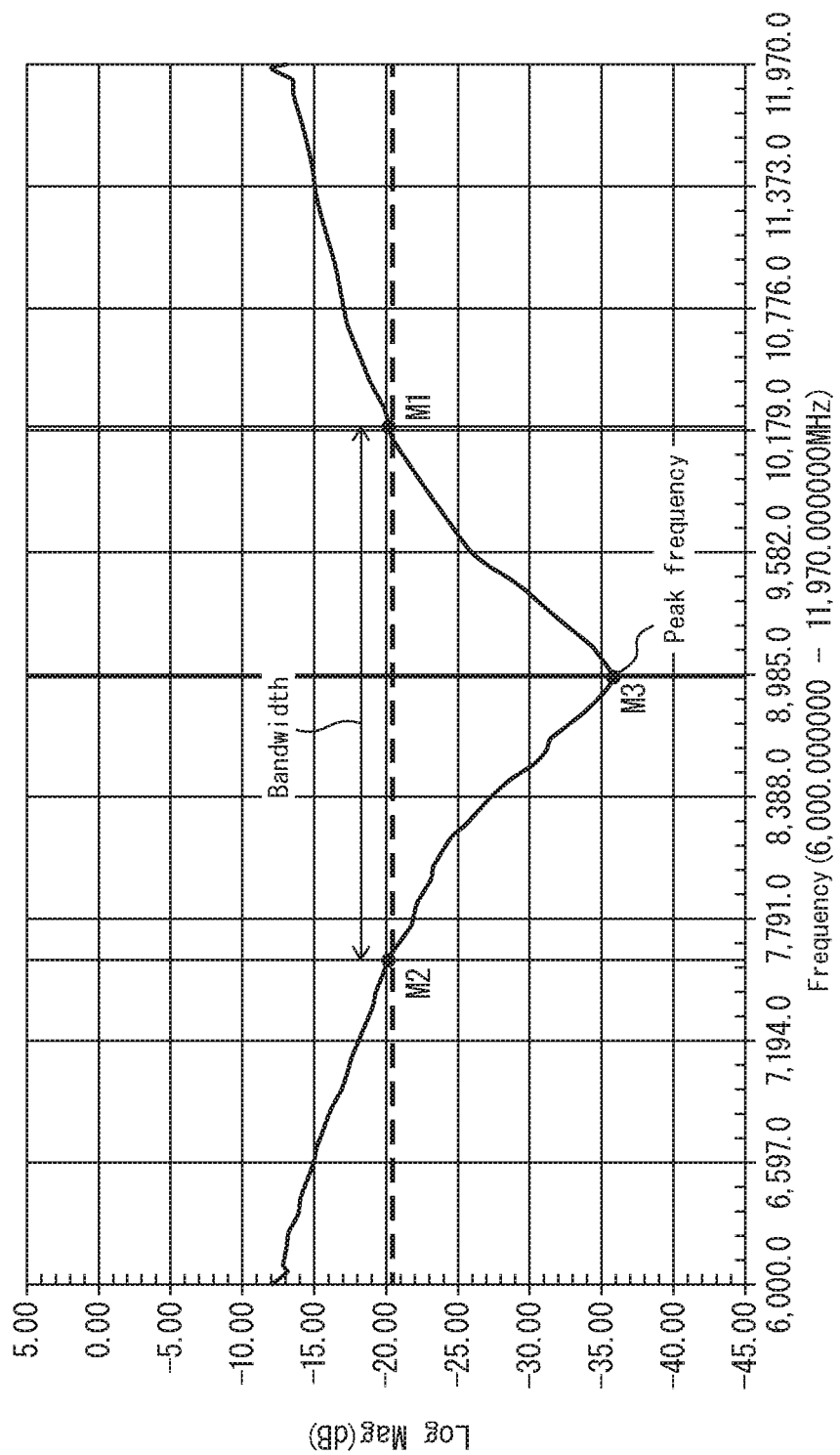
FIG. 2 is an example of a radio wave absorption chart.

The radio wave absorption of each radio wave absorption sheet was measured using a milliwave absorption measuring apparatus, in an anechoic chamber with a radio wave absorber having a radio wave absorption level of dB, installed on the wall faces and floor surface of the chamber. Specifically, a transmission horn antenna and a receiving horn antenna were installed on the radio wave absorption measuring apparatus so that the angles of incidence and angles of reflection of the transmission horn antenna and receiving horn antenna were each 10° with respect to the plane perpendicular to the floor surface, a metal reflector plate was placed at a distance of 45 cm from each antenna, and a reflected signal was received by the receiving horn antenna, defining its radio wave reflectance as 100%. The metal reflector plate was then removed and the reflected signal was received by the receiving horn antenna, defining its radio wave reflectance as 0%. A measuring sample was placed at the location where the metal reflector plate had been placed, the degree of reflection of the radio waves reflected from the measuring sample surface was measured for different frequencies, and a radio wave absorption chart was obtained with frequency (GHz) on the abscissa and radio wave absorption (dB) on the ordinate. FIG. 2 shows an example of the radio wave absorption chart.

(*) Radio Wave Absorption at Peak Frequency

The frequency with the highest degree of radio wave absorption in the radio wave absorption chart obtained by radio wave absorption measurement is the peak frequency, and the radio wave absorption at each peak frequency is shown in the tables. Lower numerical values for radio wave absorption shown in the tables indicate greater, more satisfactory radio wave absorption.

(*) Bandwidth where radio wave absorption is ≥−20 dB.

It is the difference between the maximum absorption frequency fu and minimum absorption frequency fl for −20 dB radio wave absorption, and is represented by the following formula. bw=fu−fl.

Larger numerical values in the tables indicate wider bandwidths in the milliwave range, and are more satisfactory. The symbol "-" in the tables indicates widths that were unmeasurable because the radio wave absorption did not reach −20 dB.

(*) Flexibility

Each of the radio wave absorption sheets (X-1) to (X-22) was folded 180° by hand with the radio wave reflection layer facing downward, and the folding manageability and the surface condition of the folded section were evaluated on the following scale.

G: Satisfactory folding manageability, absolutely no breakage found at folded section, F: Satisfactory folding manageability, but slight breakage found at folded section, P: Poor folding manageability, considerable breakage found at folded section.

(*Weather Resistance)

As an accelerated weather resistance test, a Super Xenon Weatherometer (trade name of Suga Test Instruments Co., Ltd.) conforming to JIS B 7754 was used, with one cycle as a total of 2 hours consisting of irradiation with a xenon arc lamp for 1 hours and 42 minutes and rainfall for 18 minutes, this being repeated for 500 cycles, after which the test object was visually evaluated.

G: Absolutely no abnormalities found on the sheet surface,
F: Slight loss of luster found compared to initial sheet surface, but without cracking,
P: Clear cracking found on the sheet surface.

(Discussion)

The results in Table 1 will now be discussed as they relate to the effect of the invention.

Examples 1 to 12 are radio wave absorption sheets within the ranges specified by the invention.

Comparative Examples 1 and 2 are radio wave absorption sheets wherein the film thickness of the radio wave absorption layer (B) was outside of the range specified by the invention.

Comparative Example 3 is a radio wave absorption sheet wherein the manganese-zinc ferrite content in the radio wave absorption layer (B) was reduced and the imaginary part of the relative permittivity of the radio wave absorption layer (B) was below the range specified by the invention.

Comparative Example 4 is a radio wave absorption sheet wherein the manganese-zinc ferrite content in the radio wave absorption layer (B) was increased and the real part of the relative permittivity of the radio wave absorption layer was outside of the range specified by the invention.

Comparative Example 5 is a radio wave absorption sheet wherein the film thickness of the protective layer (C) was outside of the range specified by the invention.

Comparative Example 6 is a radio wave absorption sheet that lacked the protective layer (C).

Comparative Example 7 is a radio wave absorption sheet that lacked the radio wave reflection layer (A).

Comparative Examples 8 and 9 are radio wave absorption sheets wherein the tangent delta value was outside of the range of the invention.

Comparative Example 10 is a radio wave absorption sheet wherein the optical reflectance of the protective layer (C) was outside of the range specified by the invention.

The following may be concluded based on the radio wave absorption property in the milliwave band, the flexibility test and the weather resistance test results for the radio wave absorption sheets prepared as described above.

If the radio wave absorption sheet comprises the radio wave reflection layer (A), the radio wave absorption layer (B) and the protective layer (C), in the specified positional relationship, the film thicknesses of the radio wave absorption layer (B) and protective layer (C) are in the prescribed ranges, and the relative permittivity of the radio wave absorption layer and the optical reflectance of the protective layer are in the prescribed ranges of the invention, then the milliwave absorption property is very excellent, the bandwidth is wide and the flexibility and weather resistance are excellent.

If the film thickness of the radio wave absorption layer (B) does not satisfy the specified condition, the milliwave absorption property of the radio wave absorption sheet cannot be adequately exhibited, but the milliwave absorption and bandwidth are drastically increased if the film thickness of the radio wave absorption layer (B) is within the range specified by the invention. (Comparison between Example 1 and Comparative Examples 1 and 2).

If the relative permittivity of the radio wave absorption layer (B) does not satisfy the specified condition, the milliwave absorption property of the radio wave absorption sheet cannot be adequately exhibited, and the milliwave absorption and bandwidth are drastically increased only if the relative permittivity of the radio wave absorption layer (B) is within the range specified by the invention. (Comparison between Example 1 and Comparative Examples 3 and 4).

In a radio wave absorption sheet without a radio wave reflection layer (A), the milliwave absorption of the radio wave absorption sheet cannot be adequately exhibited. With a combination of all of the layers, however, the milliwave absorption and bandwidth are drastically increased. (Comparison between Examples 1 and 7).

In a radio wave absorption sheet without a protective layer (C), some milliwave absorption property is exhibited but it is not adequate. The milliwave absorption property is also inadequate if the film thickness of the protective layer (C) is too large. (Comparison between Example 1 and Comparative Examples 5 and 6).

In a radio wave absorption sheet wherein the tangent delta value of the radio wave absorption layer (B) is not within the specified range, some milliwave absorption is exhibited but it is completely inadequate. The milliwave absorption property and bandwidth are drastically increased only if the tangent delta value is within the range specified by the invention. (Comparison between Example 1 and Comparative Examples 8 and 9).

In a radio wave absorption sheet wherein the optical reflectance of the protective layer (C) is not within the specified range, some milliwave absorption property is exhibited but it is inadequate, while the weather resistance is also poor, making it impractical. (Comparison between Example 1 and Comparative Example 10).

The invention claimed is:

1. A milliwave band radio wave absorption sheet comprising a radio wave reflection layer (A), a radio wave absorption layer (B) situated parallel to the top of the radio wave reflection layer (A), and a protective layer (C) situated parallel to the top of the radio wave absorption layer (B), wherein:

the real part of the relative permittivity of the radio wave absorption layer (B) at a frequency of 79 GHz is in the range of 10 to 20, the absolute value of the imaginary part is in the range of 4 to 10, the film thickness of the radio wave absorption layer (B) is in the range of 200 to 400 µm and the absolute value of the imaginary part/real part ratio of the relative permittivity is in the range of 0.30 to 0.60, and the real part of the relative permittivity of the protective layer (C) at a frequency of 79 GHz is in the range of 1.5 to 8.0, the absolute value of the imaginary part is less than 1.0, the film thickness of the protective layer (C) is in the range of 50 to 200 µm and the optical reflectance of the protective layer (C) is 50% or higher at an incident angle of 60° and 25% or higher at an incident angle of 20°.

2. The radio wave absorption sheet according to claim 1, wherein the radio wave absorption layer (B) is a film that includes dielectric powder and a binder.

3. The radio wave absorption sheet according to claim 2, wherein the radio wave absorption layer (B) includes dielectric powder at 50 to 500 parts by mass based on 100 parts by mass of the binder in the radio wave absorption layer (B).

4. The radio wave absorption sheet according to claim 2, wherein the radio wave absorption layer (B) is a film obtained by molding into the form of a film a dispersion comprising the dielectric powder dispersed in a binder.

5. The radio wave absorption sheet according to claim 2, wherein the radio wave absorption layer (B) is a coating film obtained by coating a radio wave absorption coating composition containing the binder, dielectric powder and a solvent, and drying it into a film.

6. The radio wave absorption sheet according to claim 1, wherein the protective layer (C) is a film that includes one or more resins selected from among vinyl chloride resins, polyurethane resins and polyolefin resins as a binder.

7. The radio wave absorption sheet according to claim 1, wherein the protective layer (C) is a colored film that includes a coloring agent.

8. The radio wave absorption sheet according to claim 1, wherein the radio wave reflection layer (A), the radio wave absorption layer (B) and the protective layer (C) are situated in parallel in that order.

9. A milliwave band radio wave absorption method comprising absorbing milliwave band radio waves using a radio wave absorption sheet according to claim 1.

10. A method for preventing electromagnetic interference comprising:
   installing a radio wave absorption sheet according to claim 1 on a radio wave reflector that is a cause of production of malfunctioning electromagnetic interference, or installing a radio wave absorption sheet according to claim 1 between the radio wave reflector and a radio wave receiver.

* * * * *